US010049932B2

(12) United States Patent
Barth

(10) Patent No.: US 10,049,932 B2
(45) Date of Patent: Aug. 14, 2018

(54) METHOD OF MANUFACTURING OF A SIDEWALL OPENING OF AN INTERCONNECT OF A SEMICONDUCTOR DEVICE

(71) Applicant: Intel Deutschland GmbH, Neubiberg (DE)

(72) Inventor: Hans-Joachim Barth, Munich (DE)

(73) Assignee: Intel Deutschland GmbH, Neubiberg (DE)

( * ) Notice: Subject to any disclaimer, the term of this patent is extended or adjusted under 35 U.S.C. 154(b) by 0 days.

(21) Appl. No.: 15/469,801

(22) Filed: Mar. 27, 2017

(65) Prior Publication Data

US 2017/0200645 A1    Jul. 13, 2017

Related U.S. Application Data

(62) Division of application No. 14/934,554, filed on Nov. 6, 2015, which is a division of application No. 13/484,352, filed on May 31, 2012, now Pat. No. 9,245,799.

(51) Int. Cl.

| H01L 21/44 | (2006.01) |
|---|---|
| H01L 21/768 | (2006.01) |
| H01L 21/02 | (2006.01) |
| H01L 23/48 | (2006.01) |

(52) U.S. Cl.
CPC .. *H01L 21/76898* (2013.01); *H01L 21/02203* (2013.01); *H01L 21/76802* (2013.01); *H01L 21/76831* (2013.01); *H01L 21/76895* (2013.01); *H01L 23/481* (2013.01)

(58) Field of Classification Search
CPC .................. H01L 23/481; H01L 21/76898
See application file for complete search history.

(56) References Cited

U.S. PATENT DOCUMENTS

| 7,420,238 B2 | 9/2008 | Manning et al. | |
|---|---|---|---|
| 8,148,247 B2 * | 4/2012 | Juengling | G03F 1/144 257/E21.621 |
| 2006/0057836 A1 * | 3/2006 | Nagarajan | H01L 21/76898 438/622 |
| 2007/0166997 A1 * | 7/2007 | Knorr | H01L 21/76898 438/622 |
| 2011/0198757 A1 * | 8/2011 | Su | H01L 21/7682 257/764 |
| 2012/0193797 A1 | 8/2012 | Zhu | |

(Continued)

OTHER PUBLICATIONS

A. Mercha et aL, "Comprehensive Analysis of the Impact of Single and Arrays of Through Silicon Vias Inducted Stress on High-k / Metal Gate CMOS Performance", IEEE, 2010, pp. 2.2.1 to 2.2.4.

(Continued)

*Primary Examiner* — Matthew Reames
*Assistant Examiner* — Wilner Jean Baptiste
(74) *Attorney, Agent, or Firm* — Eschweiler & Potashnik, LLC

(57) ABSTRACT

A semiconductor device includes a substrate having a top surface. A semiconductor circuit defines a circuit area on the top surface of the substrate. An interconnect is spaced apart from the circuit area and extends from the top surface into the substrate. The interconnect includes a sidewall formed of an electrically insulating material. An opening is provided in the sidewall.

6 Claims, 17 Drawing Sheets

(56) References Cited

U.S. PATENT DOCUMENTS

2012/0276711 A1* 11/2012 Yoon .................... H01L 21/764
                                                                 438/421
2012/0292782 A1   11/2012 Lee et al.
2013/0320550 A1* 12/2013 Kim .................. H01L 21/76897
                                                                 257/773

OTHER PUBLICATIONS

Masahiro Sunohara et aL, "Development of Silicon Module with TSVs and Global Wiring", IEEE, 2009, pp. 25 to 31.
Non Final Office Action dated Aug. 1, 2014 U.S. Appl. No. 13/484,352.
Final Office Action dated Feb. 23, 2015 U.S. Appl. No. 13/484,352.
Notice of Allowance dated Sep. 28, 2015 U.S. Appl. No. 13/484,352.
Non-Final Office Action dated Mar. 17, 2016 U.S. Appl. No. 14/934,554.

* cited by examiner

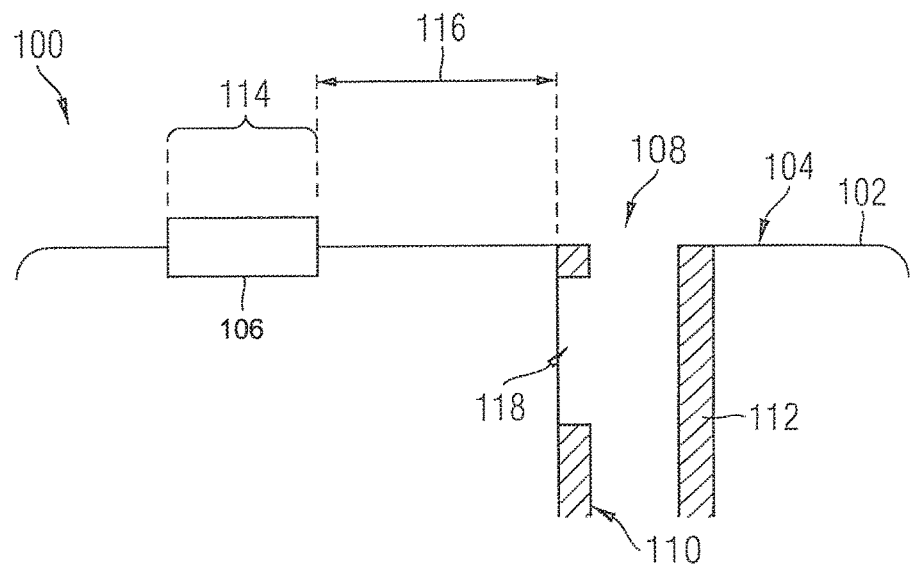
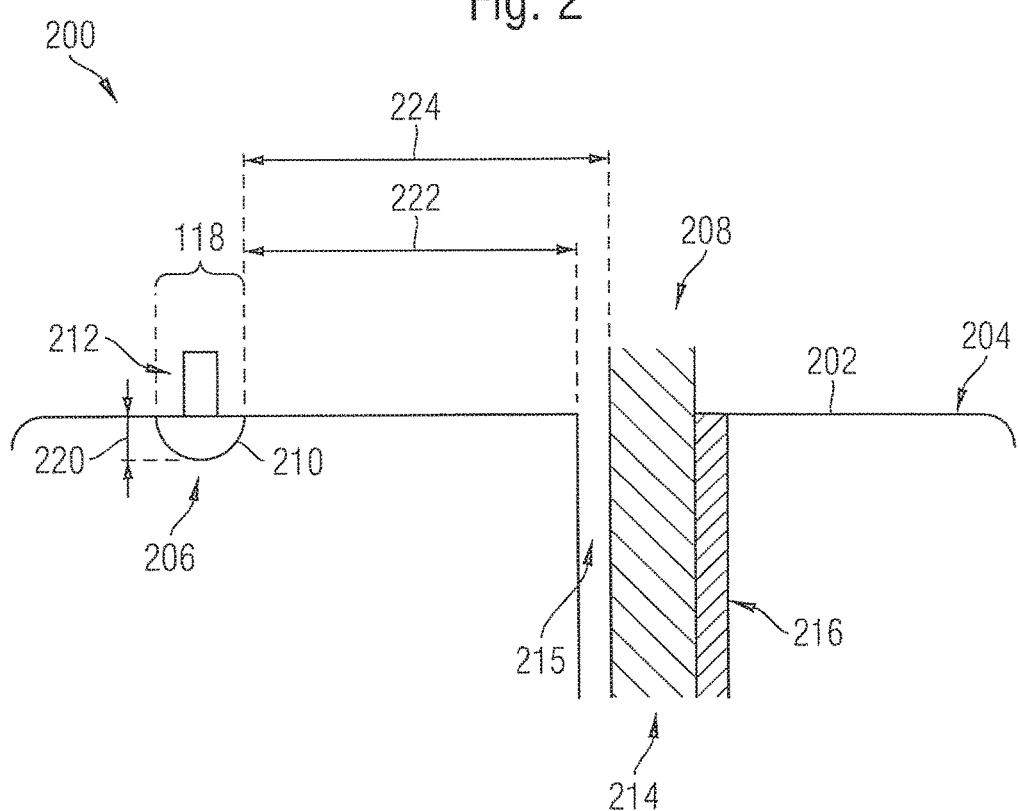

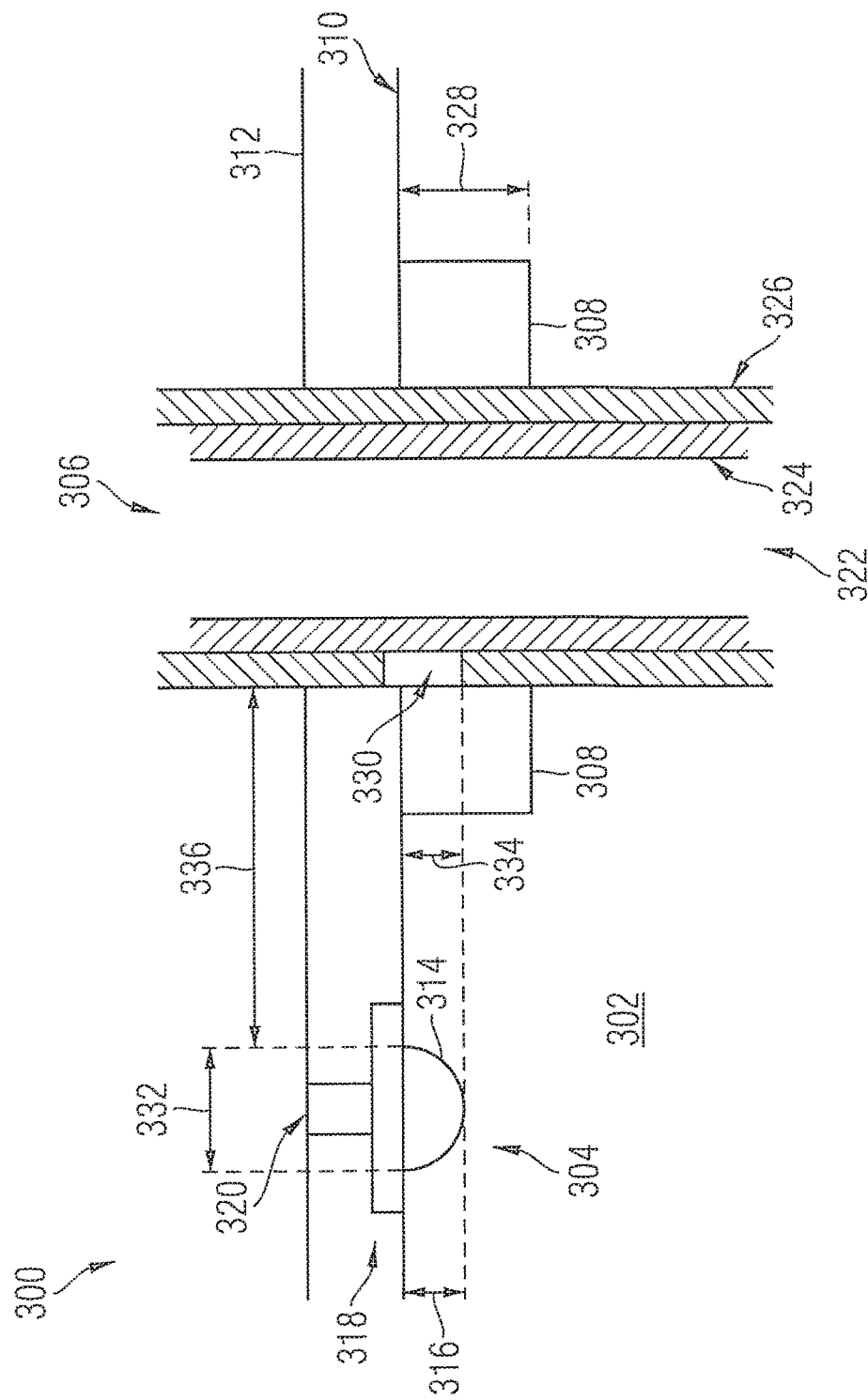

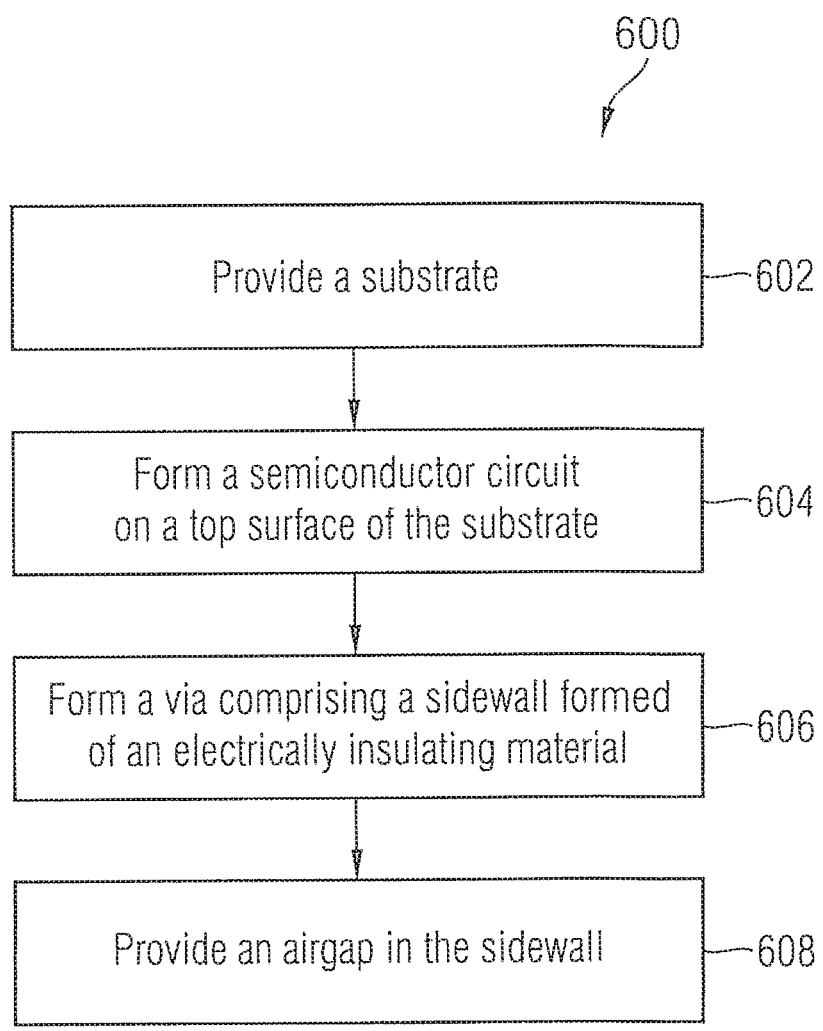

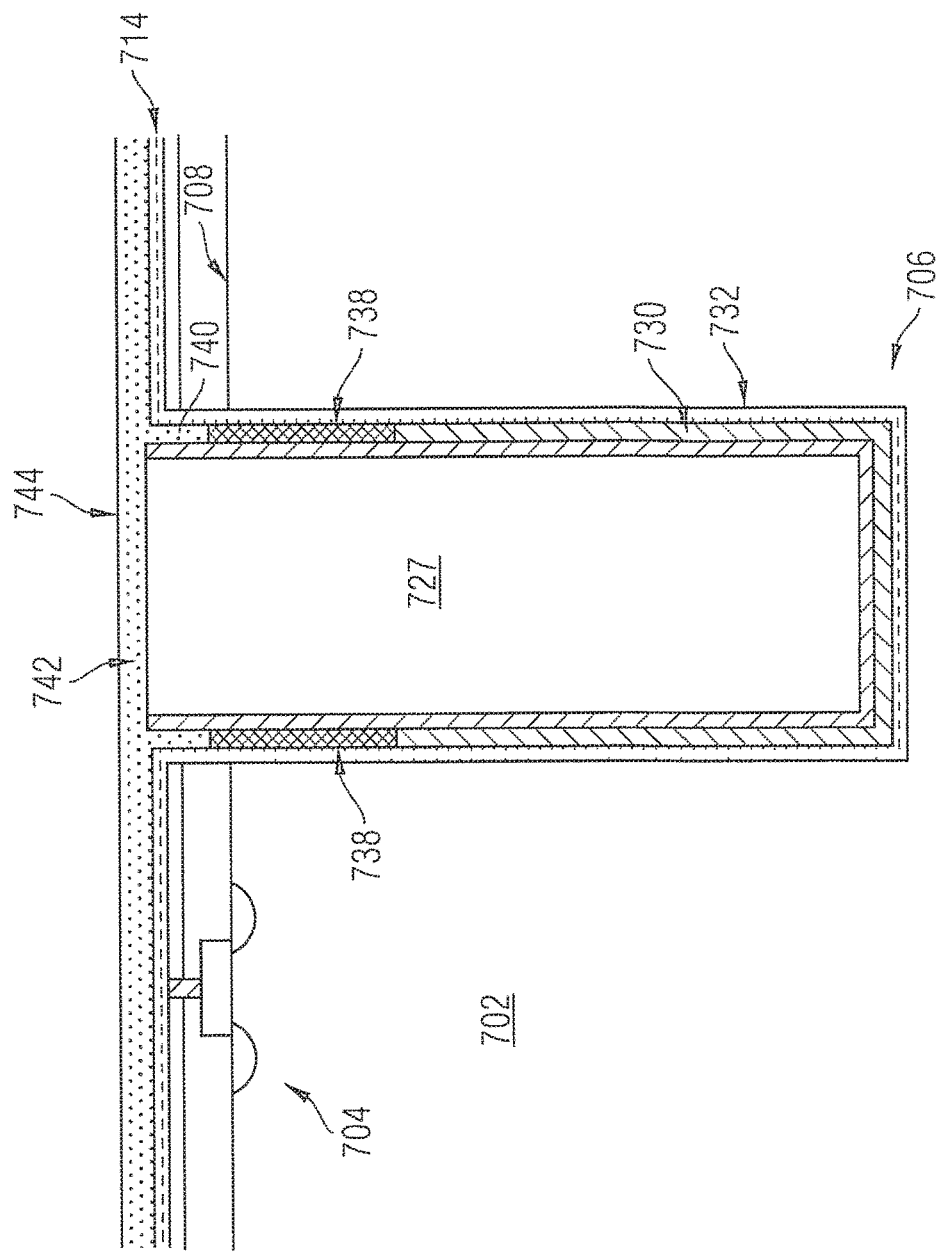

METHOD OF MANUFACTURING OF A SIDEWALL OPENING OF AN INTERCONNECT OF A SEMICONDUCTOR DEVICE

CROSS REFERENCE TO RELATED APPLICATIONS

This application is a Divisional patent application of Ser. No. 14/934,554 filed on Nov. 6, 2015, which claims priority to U.S. patent application Ser. No. 13/484,352 filed on May 31, 2012 in the name of Hans-Joachim Barth, entitled "Semiconductor Device and Method of Manufacturing Thereof" and is herein incorporated in its entirety.

FIELD

The invention relates to semiconductor devices with a substrate comprising at least one interconnect, and to a method of manufacturing such semiconductor devices.

BACKGROUND

An interconnect (Vertical Interconnect Access) provides for an electrical connection between different layers of one or more semiconductor circuits. As one example, in the field of circuit/chip packaging, the demand for increasing device performance and flexibility requires increasing integration density. Three-dimensional (3D) integration techniques such as 3D-stacking can be employed, which includes vertical interconnection of chips and circuits by interconnects.

For silicon substrates, differences in CTE (Coefficient of Thermal Expansion) between the substrate and a component of the interconnect or TSV (Through-Silicon Interconnect), for example a metal component such as a metallization or metal core, can lead to mechanical stress at certain temperature regimes, e.g., during an operation. For other substrates, similar problems can occur. For example, copper filled TSVs exhibit a severe mismatch in CTE between the silicon substrate (CTE ~3 ppm/° C.) and the copper metal core (CTE ~17 ppm/° C.). At normal operation temperatures of semiconductor devices, typically <150° C., this results in a tensile mechanical stress in the silicon substrate in the near vicinity of the TSVs.

The stress may lead to changes in parameters of semiconductor circuit elements. For example, for a transistor element, parameters such as mobility, Vth, Idsat, etc. may be influenced. Considerable parameter changes can occur, for example, for FET (Field Effect Transistor) elements such as PFETs (p-type FETs) and NFETs (n-type FETs), and can be critical in particular for elements such as PMOSFETs, analog transistors, analog circuits, etc. These stress induced parameter changes may vary depending on the orientation of the transistor gates relative to the TSVs and also on the transistor architecture. For example, traditional planar transistors may be differently affected compared to new advanced multi-gate transistors, like Fin-FETs or Tri-Gate Transistors.

To minimize these effects of an interconnect, a Keep-Out Zone (KOZ) is defined on the substrate surface which is devoid of any circuit elements, such as transistors, which could be negatively influenced by the interconnect. As an example, for a TSV with a diameter of about 5 micrometer (μm), a KOZ of between 1 μm to 20 μm may be defined for digital FETs and a KOZ of between 20 μm to 200 μm may be defined for analog FETs. In general, size and extension of a KOZ may depend, for example, on number, sizes and layouts of a single interconnect, multiple interconnects, arrays or matrices of interconnects, etc.

As is clear from the above number values, a KOZ can have a considerable impact on circuit layout, chip design, etc., as it can lead to a considerable loss of substrate area, with corresponding increases of costs for devices such as, for example, 3D-stacked chip assemblies. Therefore there is a general need for cost-efficient design and manufacture approaches for semiconductor devices including interconnects.

SUMMARY

According to one aspect of the present disclosure, a semiconductor device comprises a silicon substrate having a top surface. A semiconductor circuit defines a circuit area on the top surface of the substrate. An interconnect is spaced apart from the circuit area and extends from the top surface into the substrate. The interconnect comprises a first sidewall formed of an electrically insulating material. An opening is provided in the sidewall.

Various embodiments of the present disclosure may allow, amongst others, that a KOZ of an interconnect in a substrate can be reduced. This enables a higher integration density of circuit elements on the substrate and therefore improved cost-efficiency.

BRIEF DESCRIPTION OF THE DRAWINGS

The accompanying drawings are included to provide a thorough understanding of various aspects and embodiments of the present disclosure and are incorporated in and constitute a part of this specification. The drawings illustrate different embodiments and together with the description serve to explain miscellaneous aspects thereof. Other embodiments, aspects and advantages will be readily appreciated as they become better understood by reference to the following detailed description.

In the figures and the description like reference numerals are generally utilized to refer to like elements throughout. It is to be noted that the various elements and structures shown in the figures are not necessarily drawn to scale. Features and/or elements are illustrated with particular dimensions relative to each other primarily for sake of clarity and ease of understanding; as a consequence, relative dimensions in factual implementations may differ substantially from those illustrated herein.

FIG. 1 is a schematic, cross-sectional view of a first embodiment of a semiconductor device according to the present disclosure;

FIG. 2 schematically illustrates a second embodiment of a semiconductor device according to the present disclosure;

FIG. 3 illustrates a third embodiment of a semiconductor device;

FIG. 6 is a flow diagram illustrating an embodiment of a method of manufacturing a semiconductor device according to an aspect of the present disclosure;

FIGS. 7A to 7H are schematic, cross-sectional views illustrating a process of manufacturing a semiconductor device according to an aspect of the present disclosure.

DETAILED DESCRIPTION

Figure 4:
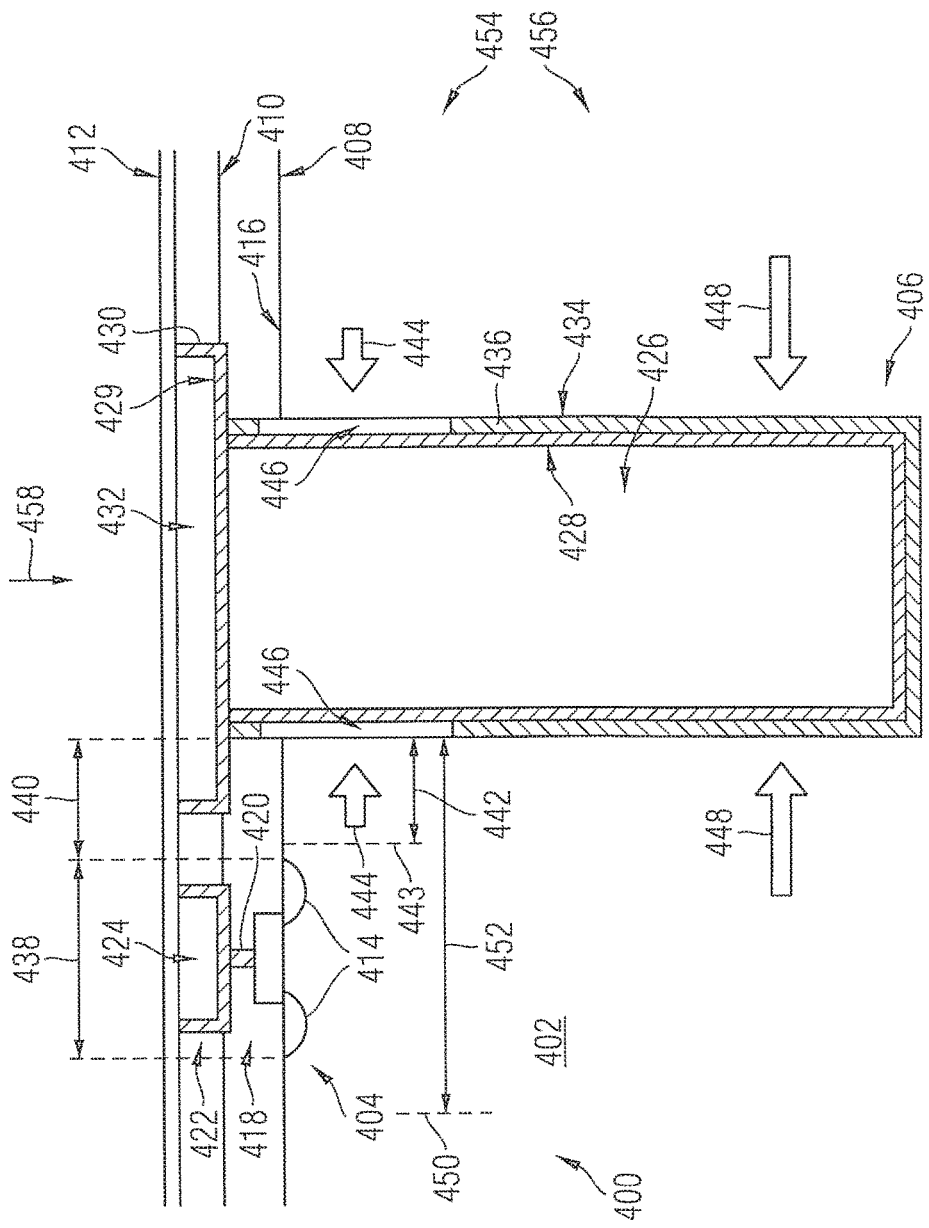
FIG. 4 schematically illustrates a fourth embodiment of a semiconductor device.

In the following description, for purposes of explanation and not limitation, by reference to the accompanying drawings, various embodiments are set forth including many specific details in order to provide a thorough understanding of various aspects of the present disclosure. It is to be understood that other embodiments can be practiced, which differ in one or more of these specific details, without departing from the scope of the present disclosure.

In the figures and the description like reference numerals are generally utilized to refer to like elements throughout. It is further to be noted that the various elements and structures shown in the figures are not necessarily drawn to scale. Features and/or elements are illustrated with particular dimensions relative to each other primarily for sake of clarity and ease of understanding; as a consequence, relative dimensions in factual implementations may differ substantially from those illustrated herein.

In addition, features or aspects disclosed may be combined with one or more other features or aspects of other implementations as may be desired and advantageous for any given or particular application. The following detailed description is not to be taken in a limiting sense, and it is intended that the scope of the present invention be defined solely by the appended claims.

As used herein, to the extent that terms such as "include," "have," "with," or variants thereof are used in either the detailed description or the claims, it is to be understood that such terms are intended to be inclusive in a manner similar to the term "comprise." The term "exemplary" or a variant thereof is meant to merely denote one or an example, rather than the best or optimum example according to any given criterion.

Semiconductor devices are referred to herein. According to various embodiments of the disclosure, a semiconductor device may comprise a semiconductor circuit, such as an electric and/or electronic circuit, an IC (Integrated Circuit), etc., wherein the circuit may include one or more semiconductor elements on a substrate. The semiconductor device may comprise multiple substrates, for example, in a lateral configuration and/or in a stacked or otherwise vertically arranged fashion. For example, the device may comprise two or more ICs in a 3D-stacked arrangement, wherein an interconnection of the stacked chips can be achieved by providing one or more interconnects.

Substrates as referred to herein may be of any material, size and shape. A substrate may be provided as a carrier for a circuit, one or more chips, and/or may be provided for implementing an interposer, etc. A substrate may be manufactured from a semiconducting material such as silicon, and/or may be manufactured from one or more insulating materials such as a metal oxide or a ceramic, and/or may be manufactured from conducting materials such as one or more metals or metal alloys, for example, lead frame metals, e.g. nickel, copper, steel, stainless steel, aluminum, etc.

A substrate may comprise a single-layer or a multi-layer structure wherein multiple layers may comprise, for example, insulating layers, conducting layers, etc. According to various embodiments, a substrate body of, for example, silicon, may carry one or more dielectric layers on at least one surface thereof, wherein conducting structures such as conducting lines, conductor paths, but also semiconductor circuitry including one or more semiconductor elements can be embedded therein. According to other embodiments, the substrate body may be composed of silicon oxide, glass, silicon carbide, organic polymers or laminate materials, etc.

Semiconductor circuits as referred to herein may comprise one or more semiconductor elements such as passive or active semiconductor elements. Non-limiting examples of passive elements comprise resistors, capacitors, inductors, etc. Non-limiting examples of active elements may include diodes, transistors, thyristors, etc. An active element may also implement a combination of one or more of the aforementioned passive or active elements; for example, an active element may comprise a combination of a transistor and a diode.

Embodiments of semiconductor elements may be implemented according to the FET (Field-Effect Transistor) technology. For example, the elements may comprise NMOS (n-type Metal Oxide Semiconductor) elements, PMOS (p-type MOS) elements and/or CMOS (Complementary MOS) elements. A semiconductor circuitry may comprise an analog and/or a digital circuitry. The semiconductor elements may comprise analog and/or digital elements such as analog transistors, digital transistors, etc.

A substrate may comprise one or more surfaces. For example, an essentially flat, disc-like or sheet-like substrate may comprise a top and a bottom surface. The terms 'top surface' or 'bottom surface' may arbitrarily refer to any one of one or more surfaces of a substrate, i.e. the term may or may not imply a vertical orientation of a substrate, a circuit implemented on the substrate, etc., and may or may not be related to an orientation of a substrate during manufacture, operation, etc.

A semiconductor circuit may define a circuit area on a surface of a substrate. The circuit area may be defined by structures which are implemented into or embedded within the substrate and which are related to one or more semiconductor elements of the circuit and contribute to defining electric, electronic or similar functional parameters thereof. Such structures may comprise, for example, doped wells of one or more circuit elements, such as the p-doped wells of a p-type FET buried into the top surface of, for example, a silicon substrate, the n-doped wells of an n-type FET embedded within a substrate, etc. Additionally or alternatively, the circuit area may include areas surrounding the beforementioned doped wells (wherein the surrounding area may be oppositely doped, or may be non-doped), as long as these surrounding areas contribute to defining the functional characteristics of one or more circuit elements. A circuit area may be defined by a projection of structures such as, for example, doped wells, onto a surface of a substrate.

An interconnect, such as an interconnect, may be referred to herein as a structure extending through a substrate, wherein any reference to a 'vertical' direction as in the conventional definition of the term "interconnect" may merely be understood as indicating, for example, a direction essentially perpendicular to a substrate surface. An interconnect may extend through an entire substrate, i.e. its depth may be identical to a thickness of the substrate, or may extend into the substrate to a limited depth only. An interconnect may be referred to as a TSV in case at least one layer and/or other portion of a substrate comprises silicon.

An interconnect may reach through further structures arranged above or below a substrate, and may reach through, for example, one or more dielectric layers, conductive layers, redistribution layers, further substrates, etc. An interconnect may comprise a contact area on one or both of its top or bottom end for establishing electrical contact to, for example, a conducting layer, for example, one or more conductor paths, a redistribution layer, a circuitry, a semiconductor element, etc.

An interconnect may comprise at least one conductive path arranged essentially along an orientation of the interconnect. For example, a conductive material such as a metal or metal alloy may be arranged in the form of a metallization layer or sidewall, a conducting line, a metal core, etc. According to various embodiments, an interconnect may comprise a sidewall, e.g., a circular, concentric sidewall, comprising one or more layers, which may be concentrically arranged. According to other embodiments the interconnect or TSV may comprise rectangular, quadratic, hexagonal or octagonal shaped sidewalls. The layers of a multi-layer sidewall may also be referred to as sidewalls herein, such that an interconnect may comprise a first, second, third, etc. sidewall.

An interconnect may comprise one or more of the following layers or sidewalls: A seed layer, a barrier layer, a metal layer, a dielectric layer, an insulating layer, an etch-stop layer, etc. According to various embodiments, an interconnect may comprise one or more sidewalls made of metal such as copper or a copper alloy, and/or may comprise one or more dielectric sidewalls. Additionally or alternatively an interconnect may comprise a core, for example, a conductive core, which can be implemented as a metal core, for example a copper core. One or more conductive sidewalls and/or a conductive core may connect to the one or more contact areas discussed above. Multiple conductive sidewalls and/or conductive core or cores may be comprised of different materials, material mixtures, material compositions, etc., or may be comprised of one and the same material, material mixture, etc. Multiple insulating sidewalls and/or insulating core or cores may be comprised of different materials, material mixtures, material compositions, etc., or may be comprised of one and the same material, material mixture, etc.

A distance, separation or spacing between an interconnect and a circuit area may, for example, be measured on a top surface of a substrate or on a top surface of another layer, for example, for ease of measurement. Such distance may refer to, for example, a minimum distance between circuit area and interconnect, e.g. a distance between a point of the circuit area nearest to the interconnect and a point of the interconnect nearest to the circuit area. The distance may refer to any points associated with the circuit area and interconnect, respectively, such as, for example points of respective contact areas on a top layer of a semiconductor device, for ease of measurement. Alternatively, a distance may be measured between a nearest point of a doped well of the circuit area and a nearest point of a conductive or non-silicon core or sidewall of the interconnect, in which case the measurement would more closely refer to a mechanical stress which may be exerted by the interconnect and which may act on a circuit element. For example, a conductive, semiconducting, or insulating structure, and/or for example any non-silicon structure, of an interconnect may have a CTE different from that of a silicon substrate (or at least silicon portions of a substrate encompassing the interconnect) and may therefore be a source of mechanical stress. Other measurement approaches may be applied, for example, as conventionally known for determining a KOZ.

The term opening as referred to herein may include any opening or gap which may, for example, be hollow, and/or filled partially or totally with a porous and/or compressible material, such as a foam, a compressible fluid such comprising a gaseous and/or liquid material, an incompressible fluid filling the gap only partially, etc. According to various embodiments, a hollow gap may be filled with air or any other fluidic or gaseous material at atmospheric pressure or higher or lower pressure.

An opening may comprise any recess, cavity, cut-out, opening, etc., which may allow for a compensation of thermal expansion required due to differing CTEs of a substrate and an interconnect. Various embodiments of an opening comprise a ring-like, semi-circular and/or concentric gap, one or more holes, through-holes, bore-holes, drill-holes, etc., a mesh-like arrangement of a plurality of holes, a porous structure, etc.

An opening may fully encompass an interconnect, for example in a concentric fashion. Other openings encompassing the interconnect partially may be arranged in a direction towards the circuit area, or into a direction or general direction towards multiple circuit areas, or into one or more opposite directions, or may be arranged in still another manner. Various orientations of an opening or openings can be contemplated for achieving, for example, a reduction of mechanical stress.

An opening may reach into a substrate for a particular depth. For example, a depth of an opening may be similar to that of an interconnect, or may be larger, or smaller. For example, an opening may have a depth similar to a depth of a semiconducting structure, e.g., a doped well, of a circuitry, or may extend deeper or less deep. An upper termination of an opening may be provided above or at a top surface of a substrate, or may be provided below a top surface, such that the opening would not be visible on a top substrate surface. An opening may be terminated or closed at a top and/or bottom thereof, or may be open.

According to various embodiments, an STI (Shallow Trench Isolation) comprised of an insulating material may be provided in a substrate area around an interconnect. The STI may be provided additionally or alternatively to an insulation provided by, for example, an insulating sidewall of the interconnect. An STI may reach into a substrate deeper than, for example, structures associated with semiconductor circuit elements. Further or other substrate features for isolating a circuitry from an interconnect can be contemplated including, for example, LOCOS (LOcal Oxidation Of Silicon), Deep Trench Isolation, etc.

Insulating layers which may be provided on top of a circuit-carrying substrate may also comprise ILDs (Inter-Layer Dielectric), IMDs (Inter-Metal Dielectric), etc. Various materials which may be contemplated as dielectric materials to be employed in insulating layers or sidewalls of interconnects, insulating layers on top or below of a substrate, etc., comprise silicon dioxide ($SiO_2$), silicon carbide (SiC), silicon carbide nitride (SiCN), silicon nitrides such as, e.g., $Si_3N_4$, organic polymers, any low k dielectric materials or high k dielectric materials, etc. One or more insulating layers comprising these or other materials may also be employed as an etch stop during manufacture of a semiconductor device.

FIG. 1 is a cross-sectional side view of an embodiment 100 of a semiconductor device according to an aspect of the present disclosure. The device 100 comprises a substrate 102, a top surface thereof being referenced with numeral 104, a schematically indicated semiconductor circuit 106 arranged at the top surface 104, and an interconnect 108 extending from the top surface 104 downwards into the substrate 102. The interconnect 108 may comprise sidewalls 110.

The substrate 102 may, for example, comprise silicon, in which case the interconnect 108 may be implemented as a TSV. A material 112 of sidewalls 110 may comprise a dielectric material for insulating conductive portions of interconnect 108 from substrate 102, for example circuitry 106 implemented thereon.

A circuit area 114 is illustrated as being defined with reference to surface 104, wherein the area 114 is defined as the projection or footprint of those portions of circuit 106 onto surface 104 which are embedded into the substrate 102 below surface 104. Other reference planes apart from top substrate surface 104 could also be used. The interconnect 108 is spaced apart by a distance 116 from the circuit area 114, wherein the separation 116 may, for example, conform to or be larger than a KOZ of interconnect 108.

An opening 118 is provided in sidewall 110 by arranging for a recess in sidewall 110. The opening 118 may, for example, be devoid of any material except of being filled with air or other gaseous composition provided at, for example, atmospheric pressure. As indicated in FIG. 1, opening 118 is arranged in sidewall 110 in a direction towards circuit area 114, i.e. in an asymmetric fashion. According to other embodiments, an opening could also be provided in a symmetric fashion including a full or section-wise circular extension. Examples will be discussed below.

FIG. 2 is a schematic cross-sectional side view on a semiconductor device 200 according to an aspect of the present disclosure. The device 200 comprises a substrate 202 having a top surface 204. A semiconductor circuit 206 is arranged with reference to substrate surface 204. An interconnect 208 extends through top surface 204 down into the substrate 202.

The semiconductor circuit 206 comprises at least one portion 210 buried or otherwise incorporated into substrate 202. Portion 210 can be implemented as one or more doped wells. A further portion 212 of circuitry 206 may extend above the substrate surface 204. A circuit area 218 is defined as a projection, to substrate surface 204, of the well 210 buried into substrate 202.

The interconnect 208 may comprise a core 214 which can be implemented, for example, as a metal core. An opening 215 is provided in a sidewall 216 of interconnect 208 in a direction towards the circuit 206, i.e. circuit area 218. The opening 215 is illustrated as extending along the length of interconnect 208, which is but one implementation of an opening having a depth larger than a depth 220 of the buried portion 210 of element 206.

The semiconductor element 206 is arranged at a distance 222 from the interconnect 208. The spacing 222 may conform to a KOZ defined for the interconnect 208 with opening 215. The distance 222 is measured between circuit area 218 and the outermost part of interconnect 208. Other distance measurement approaches can be contemplated. As an example, a distance 224 is illustrated in FIG. 2 indicating a distance of the metal core 214 of interconnect 208 from circuit area 218, i.e. including the width of opening 215. According to this approach, a separation may be measured from a portion of an interconnect having a distinctly different CTE as compared to a CTE of the substrate. As different measurement approaches lead to different distance values, a KOZ around an interconnect or multiple interconnects would have to be defined accordingly. Unless stated otherwise herein, for ease of comparison a distance between a circuit area and an interconnect is measured from an outermost portion of an interconnect, irrespective of a material thereof and irrespective of whether an opening is present or not, as exemplarily illustrated with measurement 222.

FIG. 3 illustrates an embodiment 300 of a semiconductor device according to one aspect of the present disclosure. The device 300 comprises a substrate 302, a semiconductor circuit 304, an interconnect 306, and an STI 308 arranged below a top surface 310 of the substrate 302 around interconnect 306. A dielectric layer 312 is provided on top of substrate 302. Interconnect 306 reaches through dielectric layer 312 as well as substrate 302 and may serve to provide electrical connection between device components arranged on substrate 302 and/or above or below substrate 302.

Semiconductor circuit 304 comprises at least one doped well 314 extending to a depth 316 into substrate 302. Portions 318 of circuitry 304 above substrate 302 may comprise, for example, a contact element 320 reaching through dielectric layer 312. The interconnect 306 comprises a core 322, which may be empty or filled, and a metallization layer 324 forming a conductive inner sidewall. An outer sidewall 326 of a dielectric material may further be provided for insulating interconnect 306 from substrate 302.

The STI 308 provides for an additional insulation, wherein STI 308 may or may not comprise a similar material as insulating sidewall 326. The STI 308 may extend from substrate surface 310 to a depth 328 into substrate 302. The insulating sidewall 326 and/or the STI 308 may provide for minimization of leakage currents (creepage currents) between, for example, metallization 324 and electrically active regions of circuitry 304, such as doped well 314. The presence of the STI 308 may or may not influence an extension of a KOZ around interconnect 306. For example, in case a CTE of a material of substrate 302 and a CTE of a material of STI 308 are about comparable, presence or not of STI 308 will not influence a mechanical stress exerted by interconnect 306 onto surrounding circuit elements such as element 304.

A circuit area 332 is defined by a size of buried portion 314 of circuitry 304 in surface 310. The doped region 314 may, for example, comprise an n-type well of an NFET and/or a p-type well of a PFET. Although not illustrated for the sake of clarity, a circuit area may be defined larger than a doped well or wells and may include, for example, a portion of a doped area into which the doped well or wells is/are embedded.

An opening 330 is provided in the dielectric sidewall 326 towards circuit area 332. The opening 330 may extend from top surface 310 to a depth 334 into the substrate 302. According to the exemplary implementation 300 illustrated in FIG. 3, the depth 334 of opening 330 is the same as the depth 316 of circuitry 304. According to other implementations, an opening may reach deeper, or less deep, into a substrate than a neighboring circuit element. The opening 330 extends into the dielectric layer 312, but does not reach entirely through such that air gap 330 may be closed with respect to, for example, higher layers of device 300.

The circuitry 306 is arranged at a spacing 336 from interconnect 306, measured from insulating sidewall 326 of interconnect 306 and ignoring the presence of opening 330 for the measurement. It may be assumed for the sake of discussion that the separation 336 conforms to a KOZ defined for interconnect 306 including the opening 330 thereof. The KOZ may be reduced as compared to an interconnect without opening, as the opening 330 may provide, for example, for an absorption, at least in part, of a thermal expansion and/or shrinkage of interconnect 306, for example metal portions thereof, such as metallization 324, with reference to substrate 302 and/or circuit 304. As a result, a corresponding mechanical stress may be reduced which may otherwise occur, for example, during an operation of device 300.

The opening 330 is illustrated as being arranged towards circuit element 304. It is noted that a reduction of mechanical stress acting towards circuit 304 would also be achieved at least to some degree in case an opening is arranged into other directions and is, for example, arranged on the opposite side of interconnect 306. As therefore an opening may be effective into various directions, a positioning thereof may be selected, for example, in order to optimize the effect for multiple circuit elements arranged around an interconnect.

FIG. 4 schematically illustrates a semiconductor device 400 according to an aspect of the present disclosure. The device 400 comprises a silicon substrate 402, a transistor element 404, a TSV 406, an inter-layer dielectric (ILD) 408, an inter-metal dielectric (IMD) 410 and a dielectric cap layer 412. The transistor 404 comprises first and second doped wells 414 buried into the substrate 402 below a top surface 416 thereof, The transistor 404 further comprises portions 418 above substrate 402 embedded into ILD 408 including a contact element 420 establishing electrical connection with contact terminal 422 including metallization 424 embedded into IMD 410. Regarding, for example, a stacking configuration, an interconnect stack implemented by layer 410 may be M1-level, or may be any other metal level above M1, for example M2, M3, Mtop, etc., or may be a pad metallization level.

The TSV 406 comprises a metal core 426 and a metal sidewall 428, wherein a metal or metal alloy of core 426 and sidewall 428 may be one and the same, or may comprise different metals, metal compositions, metal alloys, etc. TSV 406 is electrically connected with contact terminal 430 including metallization 432 in IMD 410. A metallization 429 of contact element 430 may or may not comprise a same material as metallization 428. TSV 406 further comprises an outer insulating sidewall 434 comprising a dielectric material 436 for insulating metal core 426 and/or inner sidewall 428 from substrate 402.

The buried portions 414 of transistor 404, which may comprise, for example, p-doped wells or the source and drain areas of a PFET, define circuit area 438 on substrate 402 surface 416. The circuit area 438 of transistor 404 is spaced-apart from interconnect 406 by a separation 440, measured from interconnect 406 outer sidewall 434 passing through surface 416 (and ignoring any opening for the measurement). A KOZ 443 may be defined by an area of unacceptable mechanical stress as indicated by arrows 444, and the separation 440 of circuit element 404 is selected to be larger or equal to KOZ extension 442, i.e. transistor element 404 is located outside the KOZ 443.

A mechanical stress, which is exerted by interconnect 406 onto surrounding substrate 402 in an upper portion 454 thereof, i.e. below surface 416, and onto circuit elements embedded into the upper substrate portion 454, is reduced by the presence of an opening 446 provided in the dielectric sidewall 436. The stress reduction is illustrated in FIG. 4 by arrows 444, which are to be compared to arrows 448 indicating a larger lateral mechanical stress exerted by a lower section of interconnect 406 onto deeper portions 456 of substrate 402. No opening is present in the lower section of interconnect 406 and the opening 446 near to substrate 402 surface 416 may not have a noticeable effect very deep in the substrate 402.

The opening 446 may, for example, allow for a thermal expansion of one or both of core 426 and metallization 428 of interconnect 406 while minimizing a pressure exerted in a lateral direction onto the surrounding substrate 402. By way of example, a distance 452 indicates in FIG. 4 the extension of a KOZ 450 as would have to be considered in the absence of any opening such as opening 446. The KOZ 450 may have a considerably larger extension 452 as compared to a size 442 of KOZ 443 when opening 446 is present.

An opening may generally have a width of a fraction of a radius or diameter of an interconnect; for example, an opening may have a width of 1% of an interconnect diameter, or of 3% of an interconnect diameter, or of 10% of an interconnect diameter. For an interconnect having a diameter of, for example, 5 micrometer, an opening measured on one side of the interconnect may have a width of 0.1 micrometer, or of 0.5 micrometer, or of 1.0 micrometer. In accordance with other embodiments, openings may have considerably larger, or smaller, widths.

The opening 446 may be seen as reducing in particular a lateral stress exerted by the TSV 406 on upper portion 454 of substrate 402, wherein it is that lateral stress that may act on transistor element 404 in influencing parameters thereof. As long as no circuit elements are arranged in a lateral relationship to interconnect 406 at lower portion 456 of interconnect 406, there may be no need to reduce the stress 448, i.e. there may be no need to provide any openings which reach substantively deeper into the substrate than any circuit elements. Generally, openings may reach below a surface of a substrate, e.g., a silicon substrate, to a depth of about or up to 1 micrometer, or up to 10 micrometer, or up to 20 micrometer, or more.

Provision of the opening 446 allows that the transistor element 404 may be placed at the comparatively small spacing 440 from the interconnect 406. Moreover, as the opening 446 is provided within dielectric sidewall 436 of interconnect 406, a loss of substrate 402 area being available on the top surface 416 for a placement of circuit elements such as transistor 404 can be minimized. The configuration of device 400 in FIG. 4 illustrates a case where no further opening except opening 446 is provided. According to other embodiments, additional openings or other stress-reducing means may be provided, e.g., in the substrate. However, also in these cases, providing an opening in a portion of an interconnect such as a sidewall thereof, e.g. in a dielectric isolation of the interconnect, minimizes a loss of substrate area for the placement of circuit elements.

An insulation of the interconnect 406 from substrate 402 may be ensured despite the presence of the opening 446 in the insulating layer 434, as long as, for example, the opening 446 itself has insulating properties. For example, the opening 446 being filled with air or other insulating medium may provide for an insulation of the inner sidewall 428 from substrate 402 as long as no direct mechanical contact is established and a disruptive voltage is avoided.

While in detail depending on a specific configuration, in general a reduction in KOZ may be similar for embodiments, in which an STI is present. As long as, for example, a KOZ extends farther from an interconnect than a size of an STI, a KOZ reduction directly translates into a corresponding gain of surface area available for circuit placement.

FIGS. 5A to 5E illustrate in cross-sectional views various exemplary configurations of openings as may be arranged within an interconnect sidewall. A direction of view may correspond to what is indicated by arrow 458 in FIG. 4.

Figure 5A:
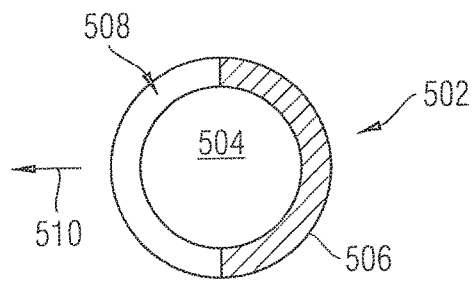
FIGS. 5A to 5E illustrate various embodiments of interconnects from a top perspective.

FIG. 5A illustrates a view onto an interconnect 502 comprising, by way of example, a metal core 504 and a dielectric side wall 506. The core 504 may or may not include a metal sidewall or barrier layer. The dielectric sidewall 506 comprises a semi-circular opening 508. The opening 508 is oriented towards a direction 510 in the example configuration 502. The arrow 510 may indicate a direction towards a semiconductor circuit, for example, to a circuit element similar to transistor element 404 in FIG. 4.

Figure 5B:
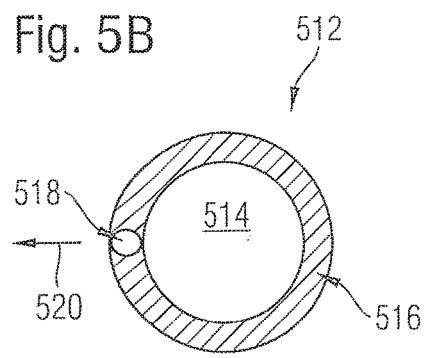

FIG. 5B illustrates an interconnect 512 comprising a metal core 514 and a dielectric sidewall 516. An opening 518 is arranged in the form of a hole, for example, a bore hole or a drilling hole, towards a neighboring semiconductor circuit as indicated by an arrow 520.

Figure 5C:
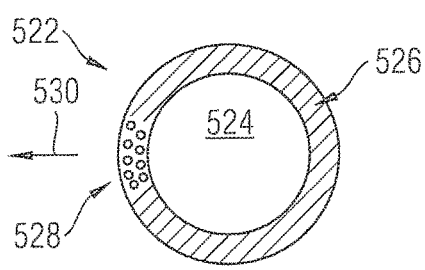

FIG. 5C illustrates a configuration of an interconnect 522 comprising a metal core 524 and an insulating sidewall 526, wherein an opening 528 is implemented as a plurality of holes arranged in sidewall 526 in a direction towards a semiconductor circuit as indicated by an arrow 530. Additionally or alternatively, an opening may be implemented by a mesh-like structure, a porous or sponge-like structure, or any other structure with a low volume filling factor defining a plurality of voids or cavities. In order to absorb, for example, a thermal expansion of metal core 524, such structure would have to have compressible properties to some degree.

Figure 5D:
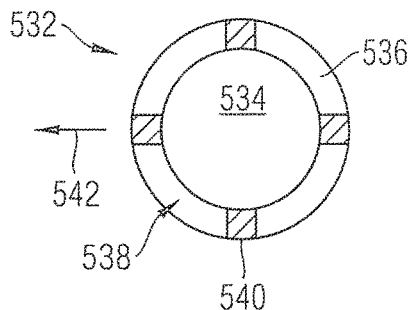

FIG. 5D illustrates in a similar way of presentation as the preceding FIGS. 5A to 5D a further configuration of an interconnect 532 comprising a metal core 534 and an insulating sidewall 536. A direction to a nearby circuitry is indicated by arrow 542. A fully circular opening 538 is implemented except from members 540 which may be arranged as bridges, bars or blades with or without perforations, as porous structures, etc.

Figure 5E:
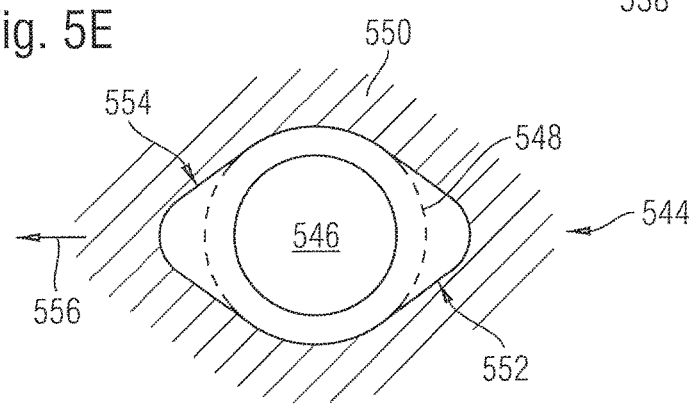

FIG. 5E illustrates an embodiment 544 of an interconnect comprising a metal core 546 and insulating sidewall 548. A surrounding substrate 550 is explicitly indicated by hatching. An opening 552 is provided in the dielectric sidewall 548, wherein the opening 552 comprises a fully circular portion of the sidewall 548 as indicated by the dashed lines, but extends further into the surrounding substrate 550 with elongated portions 554. The opening 552 is shown as being prolonged along a direction 556 to a semiconductor circuitry. Even though the opening 552 extends into the substrate 550, the portion thereof provided in the insulating sidewall 548 allows to minimize the portions 554 extending into the substrate 550.

With exemplary regard to the configuration of FIG. 5E it is recalled that an electrical isolation of an interconnect from a substrate can be maintained despite a provision of an opening in an insulating interconnect sidewall in case, for example, the opening itself may have insulating properties. For instance, an opening may be filled with an electrically insulating medium, such as, for example, air. Other examples may be soft porous or sponge like materials, like porous low k materials or foam like materials.

While in many of the configurations shown in FIGS. 5A to 5E the openings are oriented towards a nearby circuitry, it is to be noted that any of openings could also be directed towards other directions to achieve, for example, in case of multiple nearby circuit elements an optimum reduction of mechanical stress.

FIG. 6 is a flow diagram illustrating a process 600 of manufacturing a semiconductor device according to one aspect of the present disclosure. While the method 600 is shown as comprising a particular sequence of steps 602-608, according to other embodiments, the sequence of steps may be changed and/or two or more steps may be performed in parallel to each other. Additional steps may be performed and/or other steps may replace one or more of the steps 602-608.

In step 602 a substrate, for example a silicon substrate, is provided, the substrate having a top surface. In step 604 a semiconductor circuit is formed which defines a circuit area on the top surface of the substrate. In step 606 an interconnect is formed that is spaced-apart from the circuit area and extends from the top surface into the substrate. The interconnect may comprise a first sidewall formed of a first electrically insulating material. Forming the interconnect may further comprise providing a second sidewall of a second electrically insulating material different from the first electrically insulating material.

In step 608 an opening is provided in the first sidewall. The opening may be provided between the interconnect and the circuit area. Providing the opening may comprise forming a recess in the first sidewall, for example, by selective etching. The recess may be partially filled with a thermally decomposable material. Additionally or alternatively, the opening can be filled with a porous and/or curable material. Heat may be applied for decomposing the thermally decomposable material and/or for curing the material. The opening may be bridged by depositing at least one of a dielectric layer and a metallization layer on the top surface of the substrate.

Figure 7A:
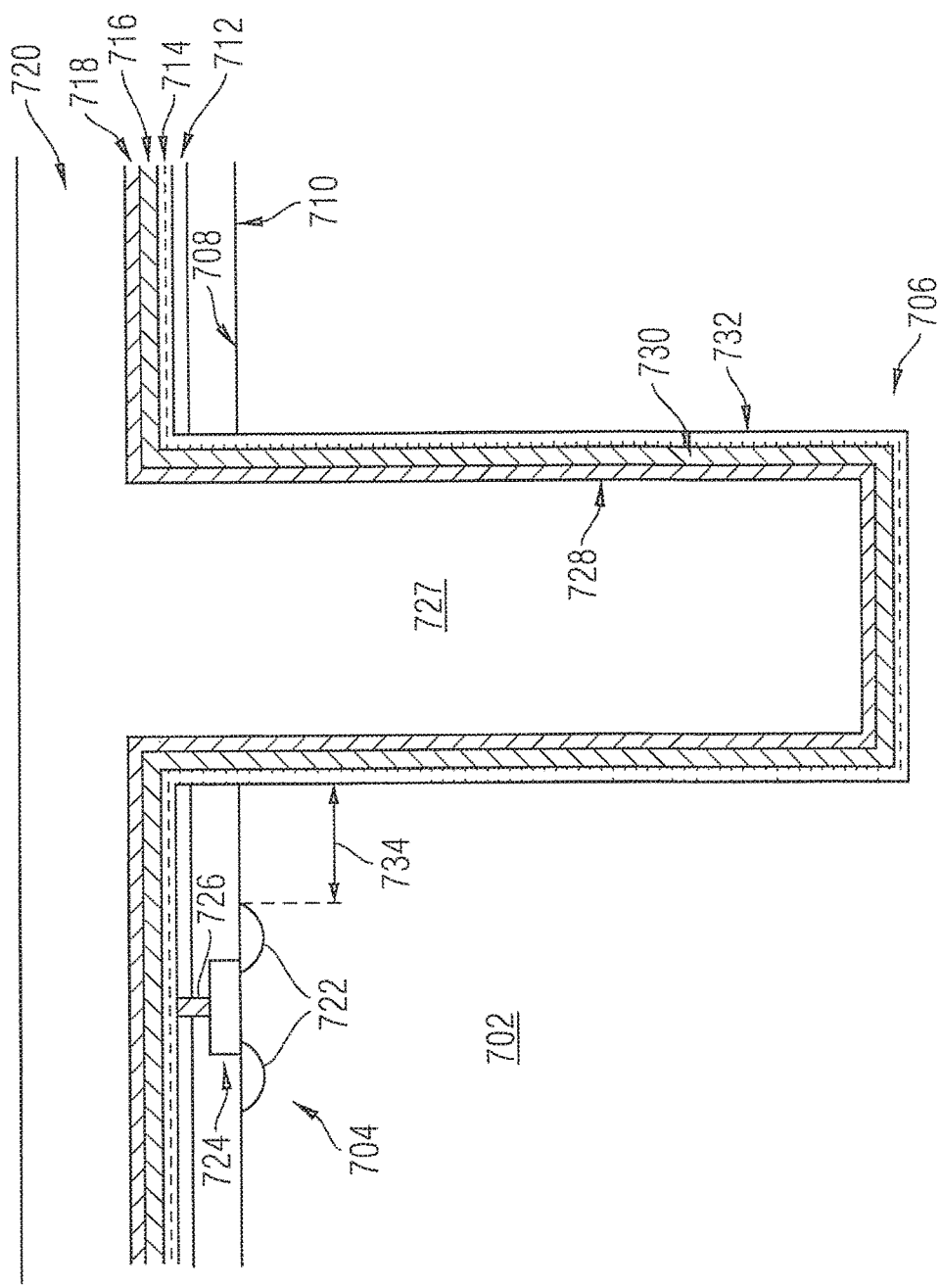

FIGS. 7A to 7H illustrate a method of manufacturing a semiconductor device according to an aspect of the present disclosure. The method may be an implementation of the process 600 of FIG. 6. In FIG. 7A an arrangement comprising a silicon substrate 702, a transistor element 704 and an interconnect 706 is illustrated. A surface 708 of substrate 702, which may be a silicon substrate, is covered with an ILD 710, an etch stop 712, a first dielectric isolation 714, a second dielectric isolation 716, a metal barrier 718, and a metal layer 720. Transistor element 704 comprises doped wells and source and drain areas 722 buried into substrate 702 below the surface 708 thereof. Transistor 704 further comprises portions 724 including a contact element 726 reaching through etch stop layer 712 towards dielectric layer 714.

With regard to interconnect 706, the metal layer 720 may form a metal core 727, the metal barrier 718 may form an innermost or first sidewall 728, the second dielectric isolation 716 may form an intermediate or second sidewall 730, and the first dielectric isolation 714 may form an outermost or third sidewall 732. For the process described hereinbelow, etch stop 712 is optional; other embodiments can therefore be contemplated in which an etch stop corresponding to layer 712 is omitted. No STI is illustrated in the figures, i.e. the interconnect 706 is directly embedded in silicon substrate 702; the presence of an STI would however not substantially change the process described in the following.

A material of one or more of metal layer 720, barrier layer 718, metal core 727, and innermost sidewall 728 may comprise any metal, for example copper, or metal alloy, wherein the various layers and sidewalls may comprise similar or different materials. A material of the dielectric isolation layer 716 and/or intermediate sidewall 730 of interconnect 706 may comprise, for example, $SiO_2$. An alternative material for the intermediate sidewall 730 may be an organic polymer, for example polyimide, etc. A material of the dielectric isolation layer 714 and/or outer sidewall 732 may comprise one or more of $Si_3N_4$, SiC, and SiCN. A material of the etch stop 712 could, for example, comprise SiC and/or SiCN. Materials of the various dielectric/etch stop layers or sidewalls, respectively, could be the same, or could be different in order to allow selective etching processes.

A diameter of interconnect 706 including or excluding the various sidewalls may be in the range of one to several micrometers and may, for example, be about 5 micrometer. A distance 734 between interconnect 706 and transistor element 704 may correspond to or may be larger than a KOZ of interconnect 706. The KOZ may be defined smaller as conventionally prescribed due to the presence of an opening in the sidewall of interconnect 706, the formation thereof will be described hereinbelow. Generally, regarding the distance 734 between transistor 704 and interconnect 706, the discussion related to FIG. 4, separation 440, KOZ 443 and 450 may apply accordingly.

Figure 7B:
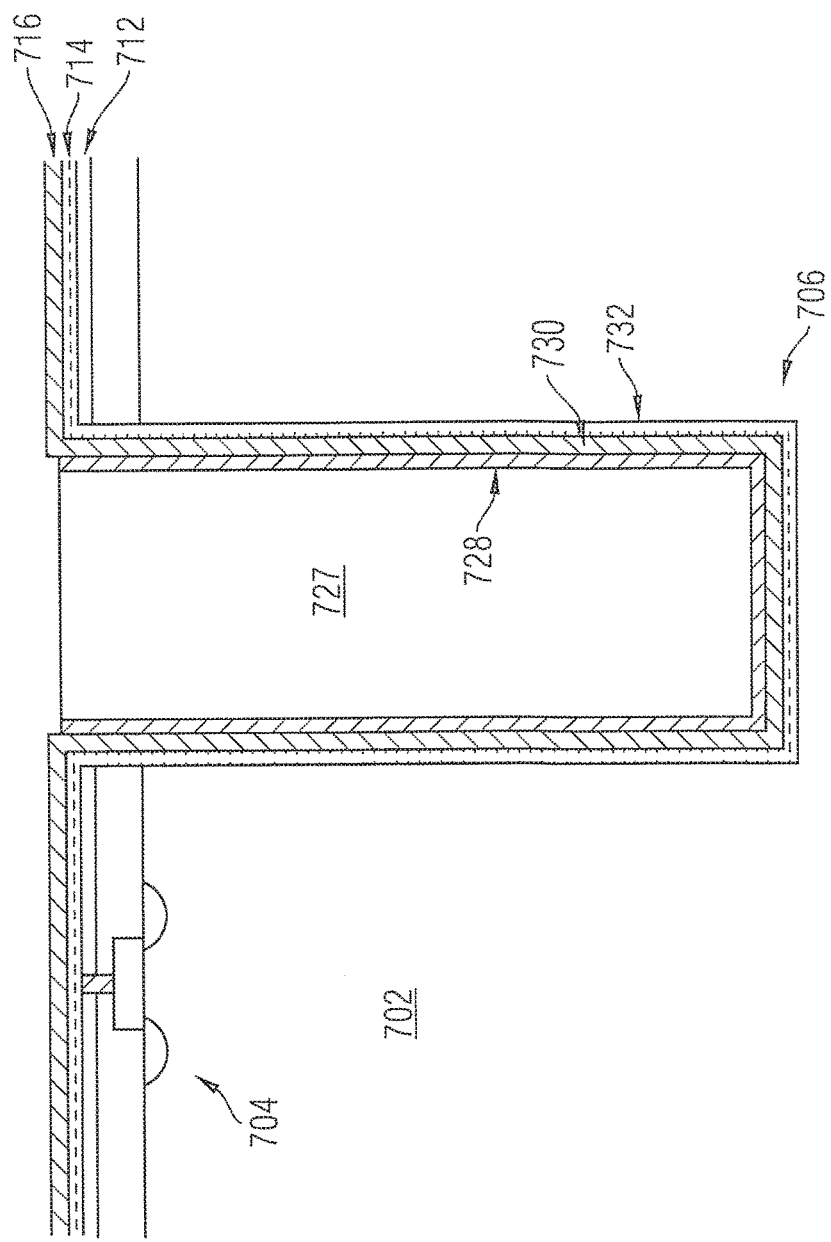

According to a process status illustrated in FIG. 7B, the metal layer 720 and metal barrier 718 has been removed, for example, by applying a process such as CMP (Chemical-Mechanical Planarization). Optionally, a partial or full CMP of the second dielectric isolation 716 could also be performed. Accordingly, the CMP process stops either in the second dielectric isolation layer 716, or in the first dielectric isolation layer 714.

Figure 7C:
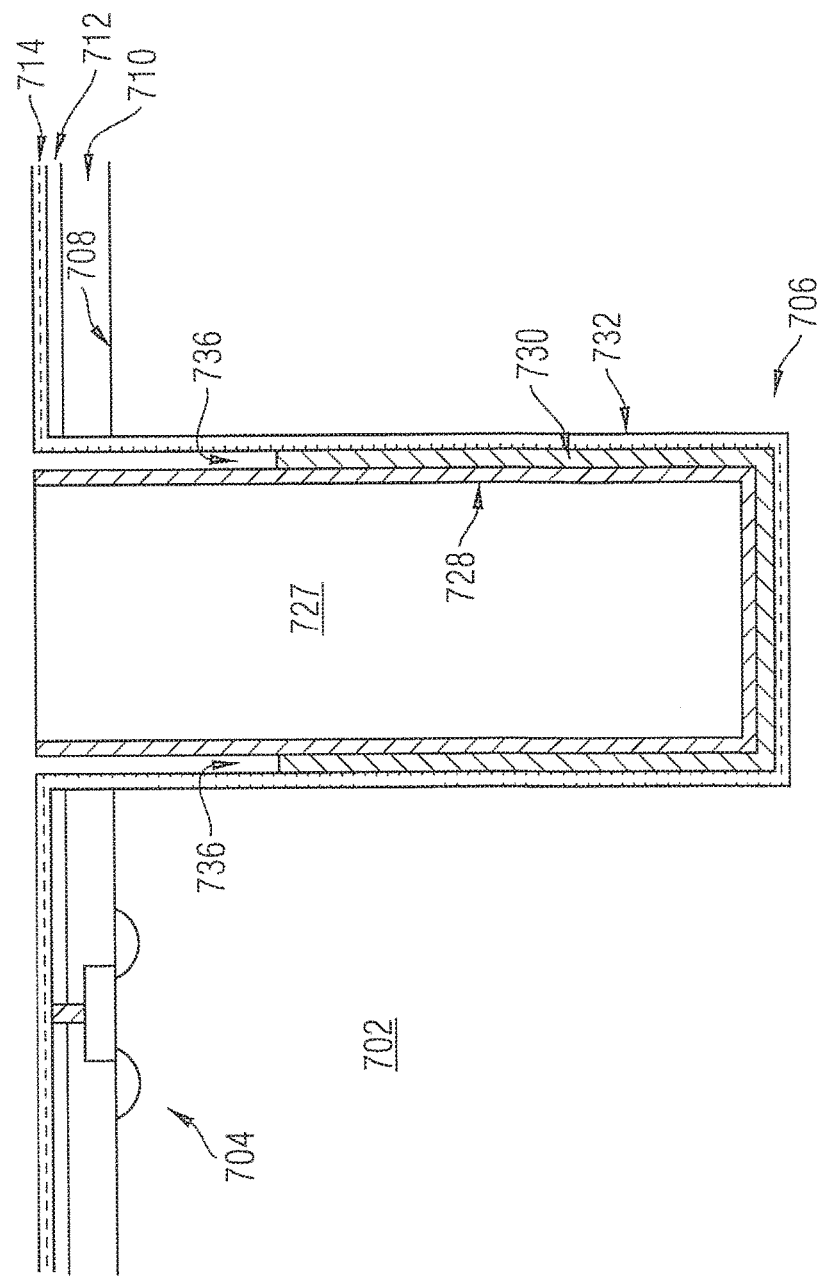

According to FIG. 7C, a selective etch back is performed on the remaining of the second dielectric isolation 716 and intermediate sidewall 730. For example, a wet etching may be performed. As a result, a recess 736 is formed in sidewall 730 outside of the interconnect 706 metal fill, i.e. metal core 727 and innermost sidewall 728, but inside the outermost insulating sidewall 732. The dielectric isolation 714 may protect the etch stop 712 and/or ILD 710 from the etch attack. The recess 736 may reach below the top surface 708 of substrate 702 to a depth of, for example, between about 1 μm to 10 μm.

Figure 7D:
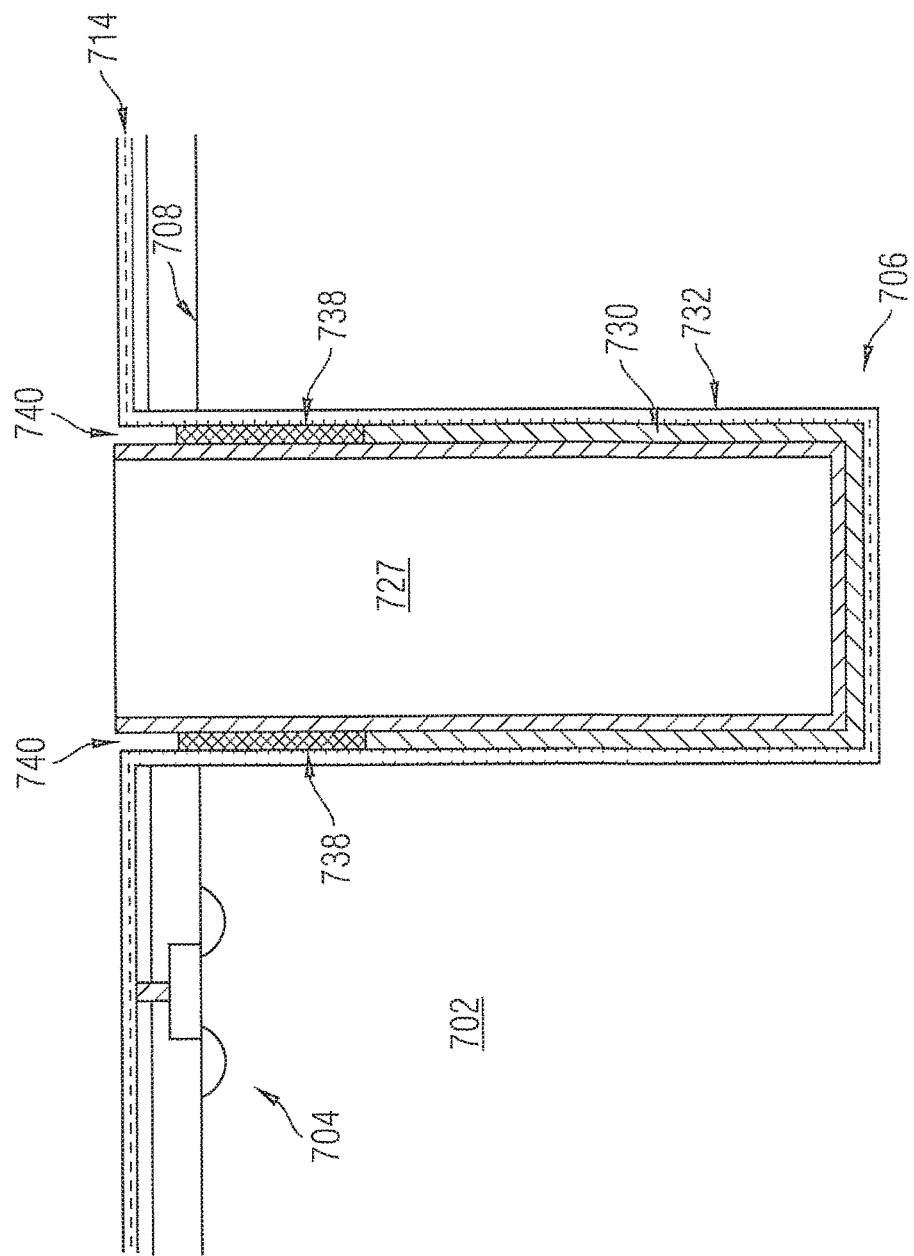

According to FIG. 7D, recess 736 is filled with a fill 738. A material of fill 738 may, for example, comprise a thermally decomposable material such as a spin-on polymer. A recess 740 may be formed by, for example, an etch back process, wherein the recess 740 is formed such that fill 738 reaches above the top surface 708 of substrate 702.

According to FIG. 7E, the recess 740 is re-filled with a material 742 which is applied by forming a layer 744 on top of the dielectric isolation layer 714. The material 742 may, for example, comprise a porous material, for example a low-k porous material with interconnected pores. Other porous or permeable materials can be contemplated for filling the recess 740.

Figure 7F:
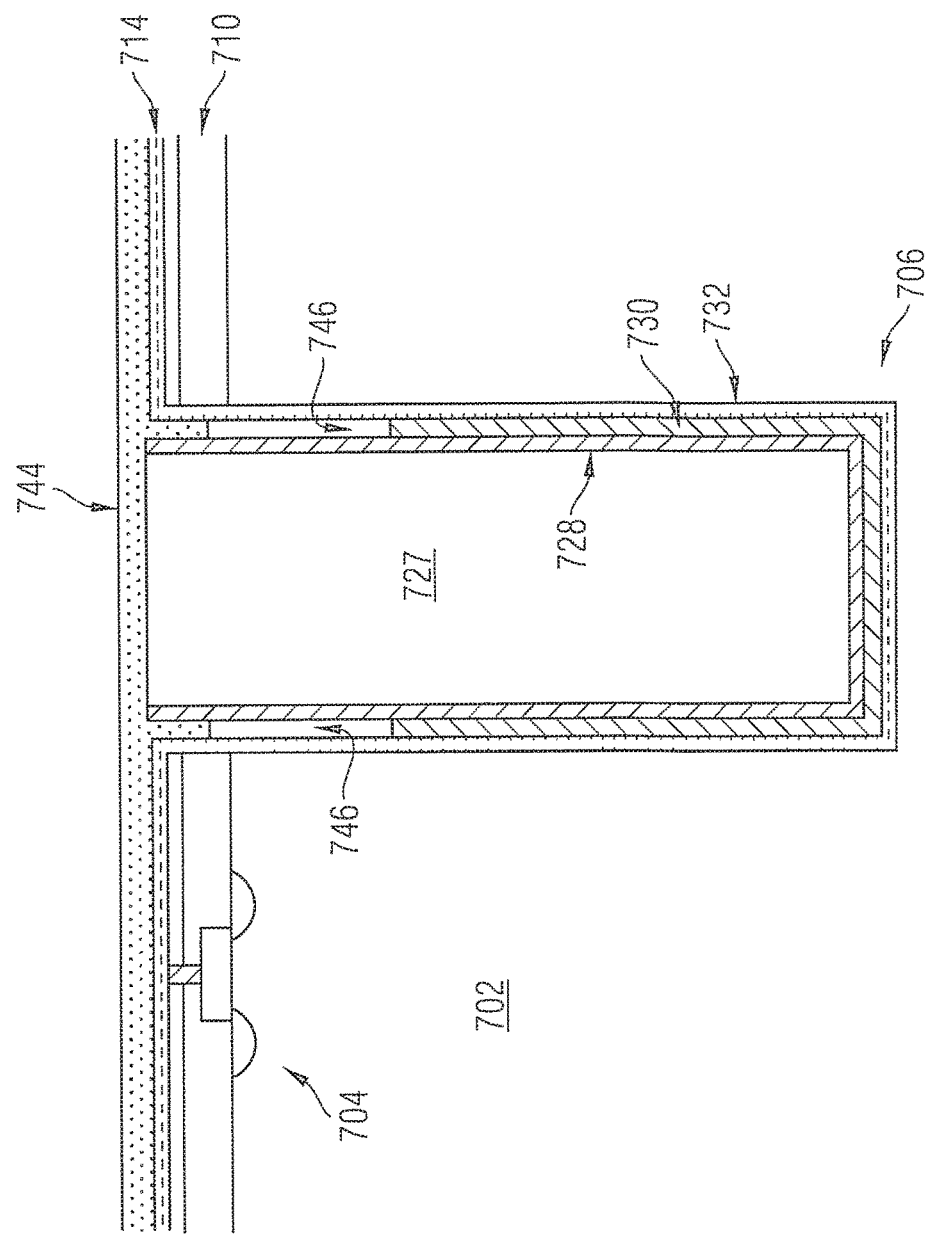

According to FIG. 7F, a curing and annealing step is performed, for example, at temperatures below or up to 400° C. The material of fill 738 illustrated in FIGS. 7D and 7E is decomposed and out-gassed interconnect the porous material 742 filling recess 740 and layer 742. As a result, an opening 746 is formed in the insulating sidewall 730.

Figure 7G:
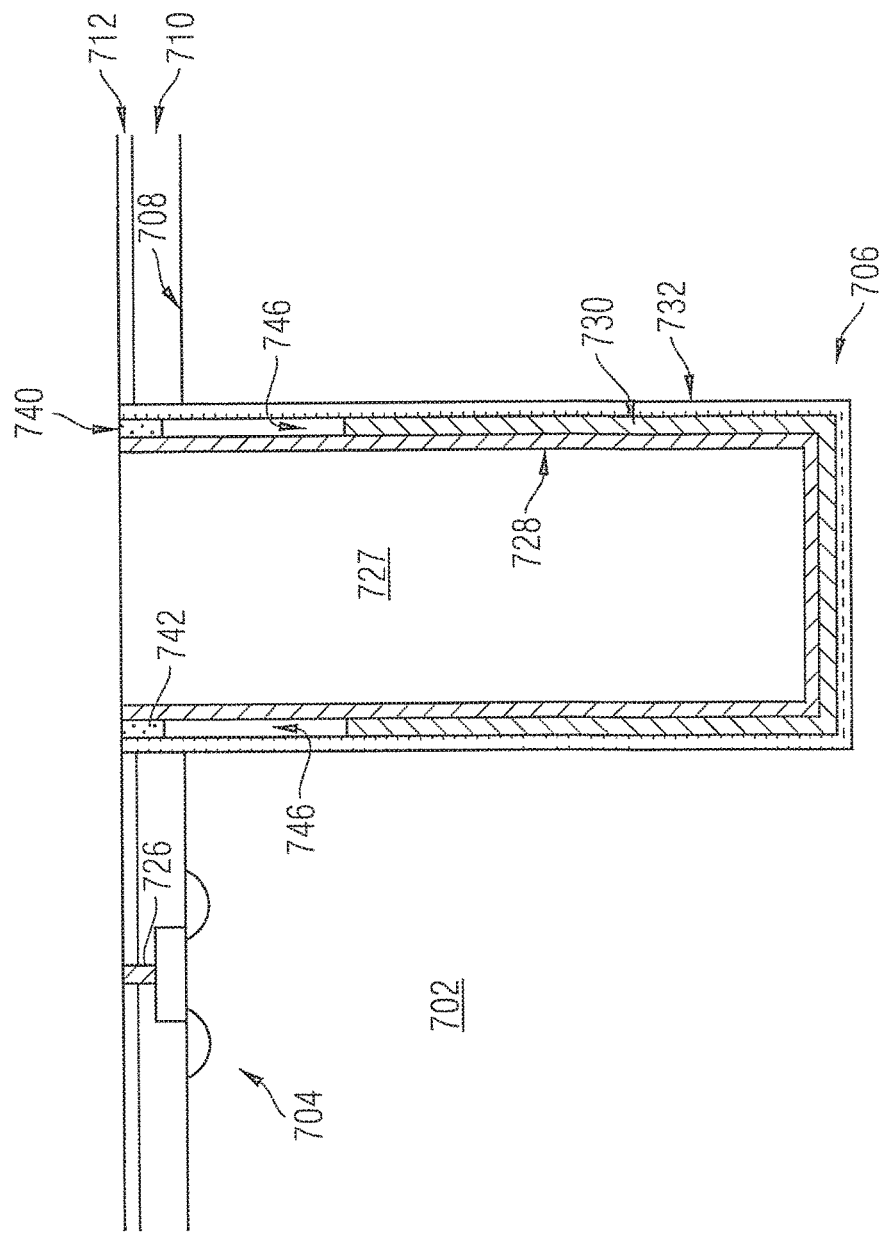

According to FIG. 7G, layer 744 with porous material 742 has been removed, for example, by a touch-up CMP and/or an etch back process. Recess 740 is filled with remaining material 742. The dielectric isolation 714 may also be removed on planar surfaces above substrate 702, wherein a CMP/etch stop is provided by the etch stop layer 712 and/or the ILD 710. As a result, contact element 726 of transistor 704 and metallization of interconnect 706 including core 727 and/or metal sidewall 728 are exposed. Contact 726 may, for example, be implemented as a W-plug.

Figure 7H:
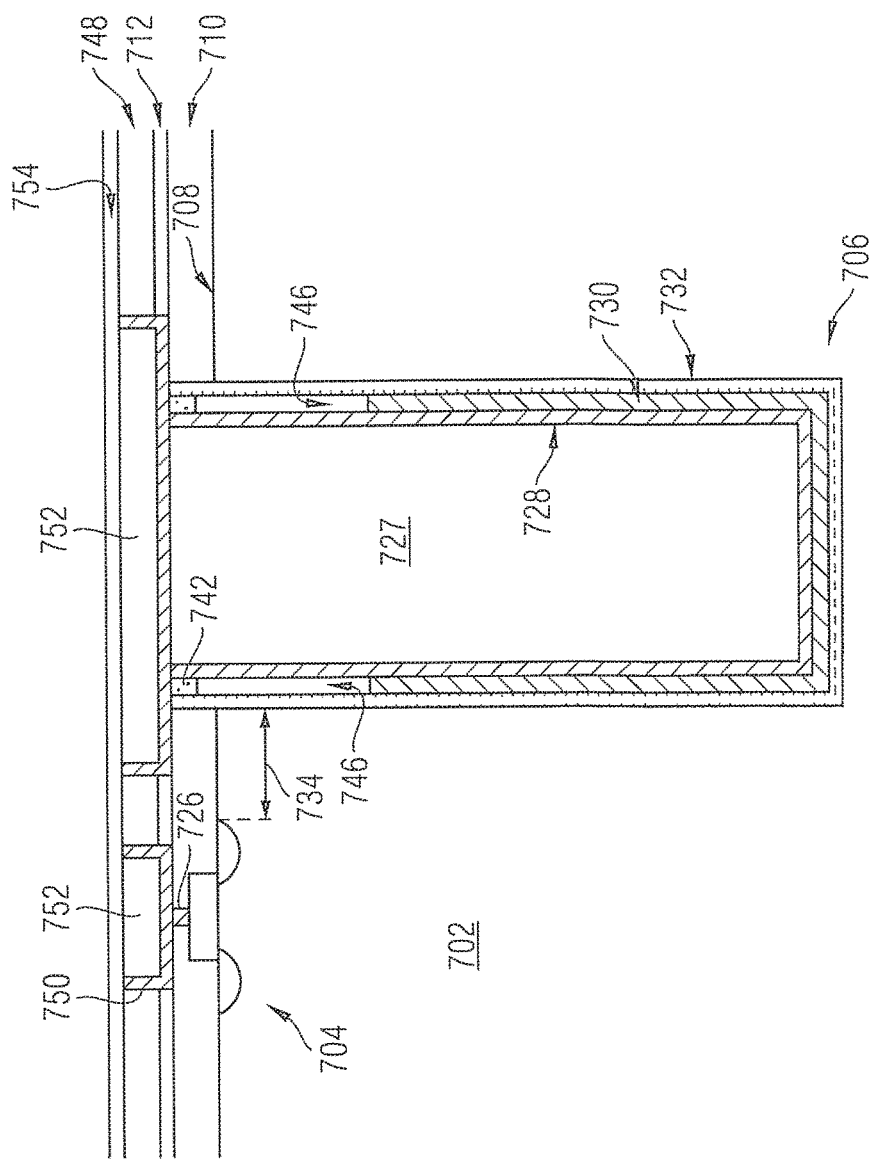

According to the process status illustrated in FIG. 7H, the example process has been continued with a standard M1 process module. This may comprise, for example, a deposition of an inter-metal dielectric (IMD) 748 on top of etch stop layer 712 and/or ILD 710. This may further comprise an M1 patterning comprising, for example, a provision of metal barrier and seed layers/metal layers 750; an M1 trench fill with, for example, a metal material 752; and/or a deposition of an M1 dielectric cap layer 754. Further process steps or process modules may subsequently be performed.

The process illustrated in FIGS. 7A to 7H employs a bi-layer dielectric insulation with the layer 714 comprising a silicon nitride ($Si_3N_4$) or a silicon carbide or silicon carbide nitride to protect an underlying ILD 710 (and optionally an STI) from etch attack during a recess 736 etch of the further insulating layer 716 which may comprise, for example, silicon dioxide. Both insulating layers form insulating sidewalls 732, 730 of interconnect 706. As a result, the TSV 706 after formation of opening 746 in inner insulating sidewall 730 still comprises a dielectric insulation, represented by insulating sidewall 732, towards silicon substrate 702. In addition silicon nitride, silicon carbide or silicon carbide nitride have the benefit to be excellent diffusion barriers against the out-diffusion of metal ions, e.g. Cu ions, from the core metal fill 727 of the TSVs.

The formation of openings 746 as illustrated by the process of FIGS. 7A to 7H obinterconecttes the need for additional or other, and expensive, lithography steps. As a result, the air gap 746 and the reduced KOZ around interconnect 706 resulting therefrom can be provided in a cost-efficient way.

FIGS. 8A to 8D illustrate an alternative to the process of FIGS. 7A to 7H. Any aspect not explicitly discussed with reference to the configuration of FIGS. 8A to 8D may be assumed to be similar to what has been discussed for the configuration of FIGS. 7A to 7H.

Figure 8A:
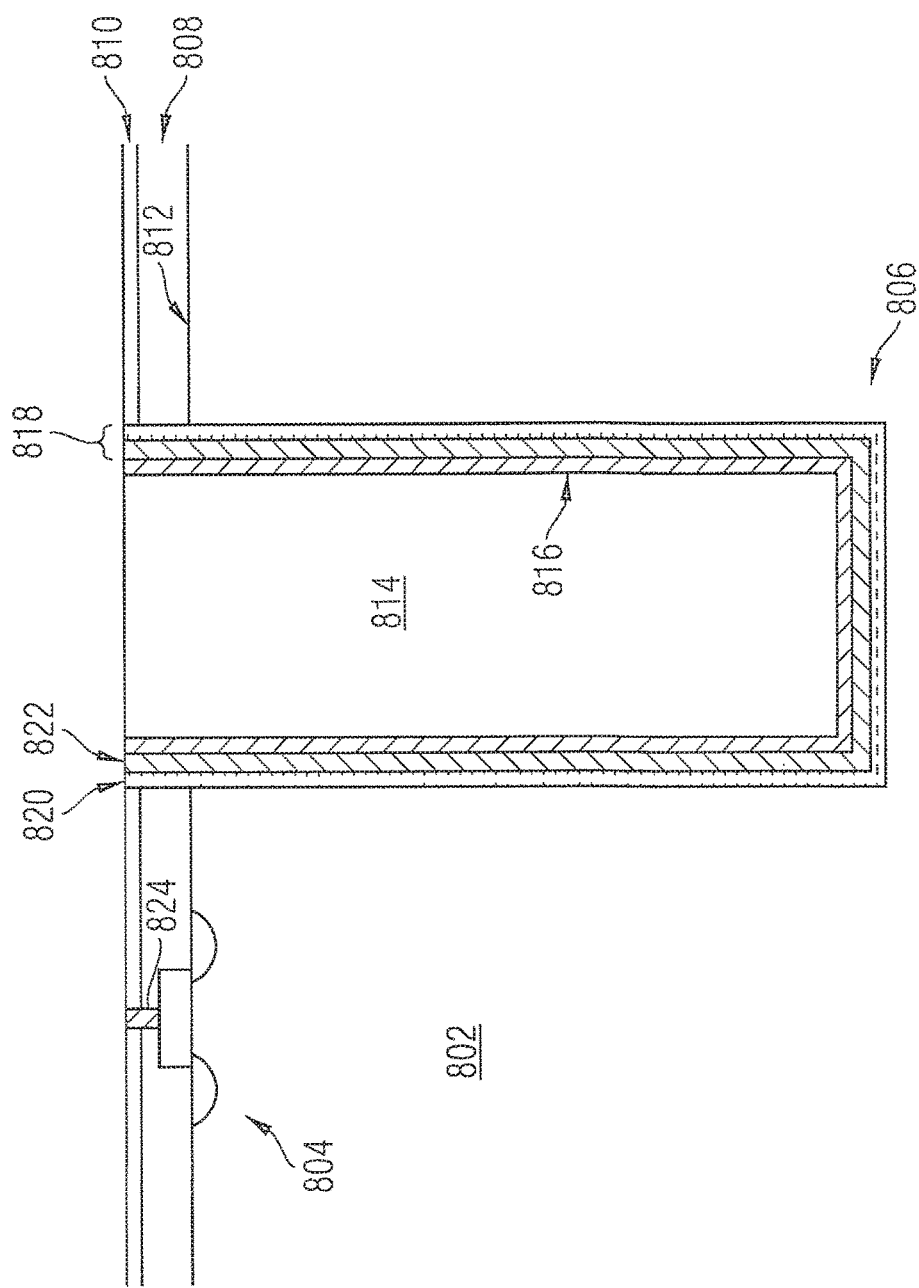
FIGS. 8A to 8D are schematic, cross-sectional views illustrating a further process of manufacturing a semiconductor device.

The process may start from a configuration similar to that shown in FIG. 7A. While FIG. 7B refers to a process wherein only a metal layer or layers are removed, FIG. 8A shows a result of additionally removing any insulating/dielectric layer on planar surfaces above a silicon substrate 802. Specifically, the configuration of FIG. 8A comprises, as an exemplary circuit element, a transistor 804, and an interconnect (TSV) 806 arranged in silicon substrate 802. Over a top surface 812 of substrate 802, an ILD 808 and an etch stop 810 are provided.

The interconnect 806 comprises a core 814 and an innermost sidewall 816, wherein one or both of core 814 and sidewall 816 may comprise a metal such as copper or an alloy thereof. Alternative materials for the core 814 may be aluminum or tungsten. Alternative materials for the sidewall 816, which has the function of metal diffusion barrier and/or seed layer, may be titanium, titanium nitride, tantalum, tantalum nitride, tungsten, tungsten nitride, cobalt or ruthenium, etc. or combinations thereof. The interconnect 806 further comprises a bi-layer dielectric insulation 818 including an insulating outermost sidewall 820 and an insulating inner sidewall 822, wherein the first and second insulation sidewalls 820, 822 may be comprised of different dielectric materials.

The removal of any layers above the ILD 808 is stopped on or in etch-stop layer 810 and may comprise the exposure of contact 824 of transistor 804 and of the copper core 814 and metal sidewall 816 of TSV 806. Accordingly, the etch stop layer 810 may be a necessary component for the process illustrated with FIG. 8A et seq.

Figure 8B:
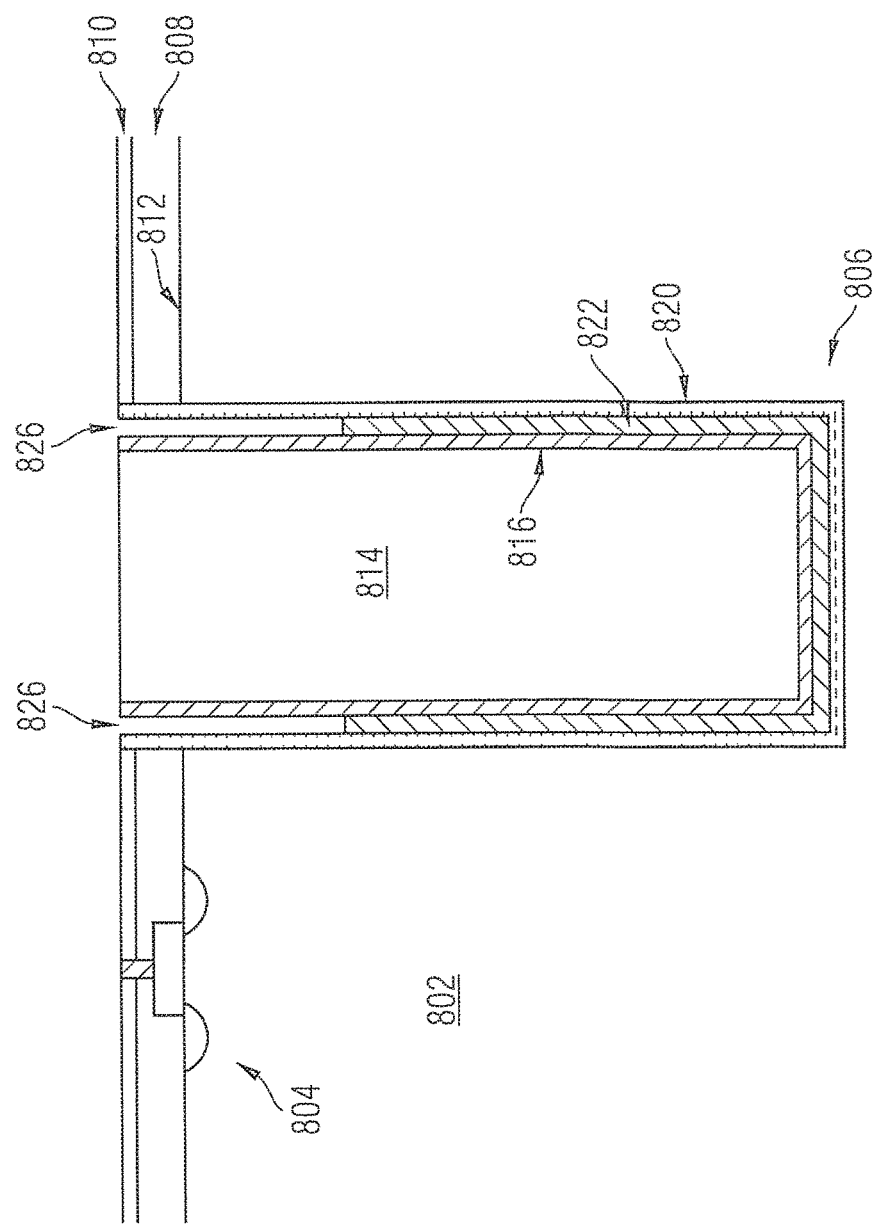

According to FIG. 8B, a recess 826 is formed in the inner insulating sidewall 822 by removal of the dielectric material thereof, wherein the recess 826 may reach between about 1 μm to 10 μm below the top surface 812 of substrate 802. The recess 826 may be formed by etching, for example, by wet etching. The etch, in one embodiment, is selective to the material of the outer insulating side wall 820 and the planar etch stop 810 on top of the IDL 808.

Figure 8C:
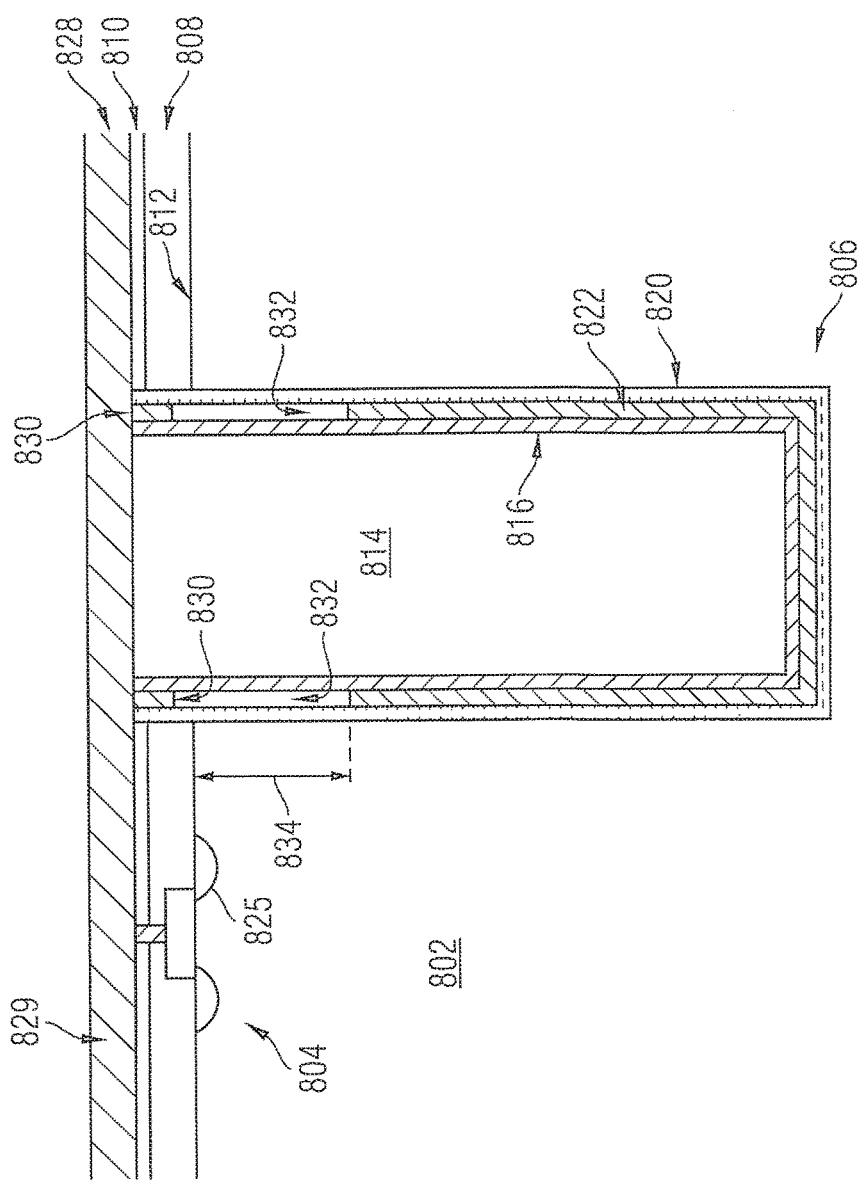

According to FIG. 8C, an IMD 828 is provided on top of ILD 808, etch stop 810, and TSV 806. A material 829 of IMD 828 may, for example, comprise a dielectric material, including low-k and/or porous dielectric materials. The IMD 828 may be deposited, for example, by chemical-vapor deposition (CVD) and/or any other appropriate process. As indicated by recess closure components 830, the top of recess 826 can be closed or filled in order for the formation of an opening 832. For example, the opening 832 may be bridged by material 829 of the IMD 828. In this way, the opening 832 may extend in a vertical direction from above the top surface 812 of substrate 802 to a depth 834 below the top surface 812. The depth 834 may be selected to be deeper than structures of semiconductor element 804 such as, for example, the doped wells 825 thereof.

Figure 8D:
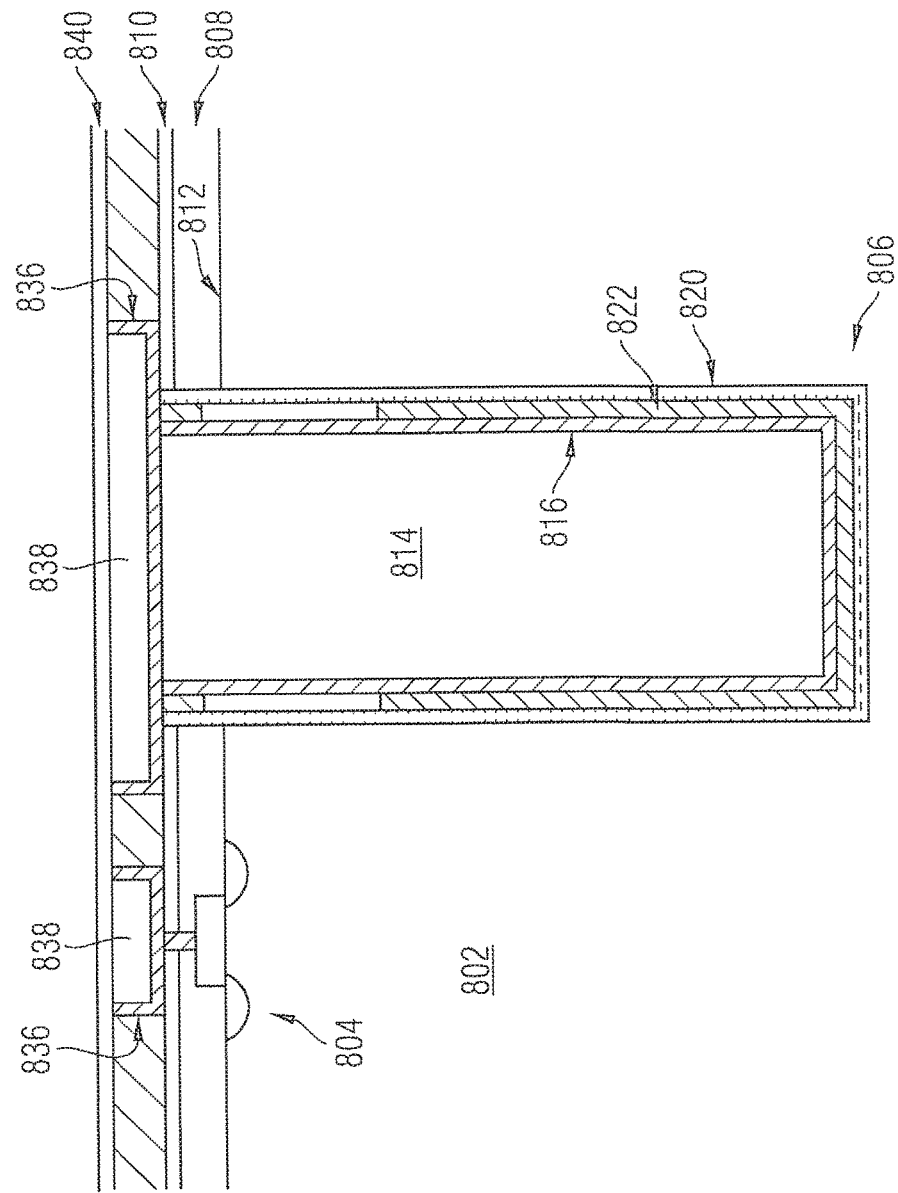

According to the process status illustrated in FIG. 8D, the example process has been continued with a standard M1 process module. This may comprise, for example, an M1 patterning comprising, for example, a formation of trenches and a provision of seed layers/metal barrier layers 836; an M1 trench fill with, for example, a metal material 838; and/or a deposition of an M1 dielectric cap layer 840. Further process steps or process modules may subsequently be performed.

While the manufacturing methods of FIGS. 7A to 7H and 8A to 8D have been illustrated as relating to a metallization layer M1, an electrical connection between an interconnect and an interconnect stack can also be realized in any other metal level above M1, for example in M2, M3, . . . , Mtop, or in a pad metallization level or an external metallization level.

While a particular feature or aspect of an embodiment of the present disclosure may have been described with respect to only one of several implementations, such feature or aspect may be combined with one or more other features or aspects of the other implementations as may be desired and advantageous for any given or particular application.

While various aspects of the present disclosure have been illustrated and described, modifications may be made thereto without departing from the scope of the appended claims. With particular regard to the various functions performed by the above-described components or structures (assemblies, devices, circuits, systems, etc.), the terms (including a reference to "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations.

What is claimed is:

1. A method of manufacturing a semiconductor device, comprising:
    providing a substrate having a top surface;
    forming a semiconductor circuit defining a circuit area on the top surface of the substrate;
    forming an interconnect spaced apart from the circuit area and extending from the top surface into the substrate, the interconnect comprising:
        a first sidewall formed of a first electrically insulating material;
        a second sidewall formed of a second electrically insulating material, the second sidewall being arranged inside the first sidewall;
        a third sidewall formed of an electrically conducting material, the third sidewall being arranged inside the second sidewall, and
    providing an opening within the second sidewall, wherein the opening extends laterally between an outer surface of the third sidewall and an inner surface of the first sidewall, wherein the outer surface of the third sidewall contacts the opening on one side, and the inner surface of the first sidewall contacts the opening on another, opposing side.

2. The method of claim 1, wherein forming the opening comprises forming a recess within the second sidewall by selective etching.

3. The method of claim 2, wherein forming the opening further comprises partial filling of the recess with a thermally decomposable material.

4. The method of claim 2, wherein forming the opening further comprises depositing at least one of a dielectric layer and a metallization layer bridging the opening.

5. The method of claim 3, wherein forming the opening further comprises filling the recess further with a porous and curable material.

6. The method of claim 5, wherein forming the opening further comprises applying heat for decomposing the thermally decomposable material and for curing the porous material.

* * * * *